United States Patent [19]

Lev

[11] Patent Number: 5,122,926
[45] Date of Patent: Jun. 16, 1992

[54] HOUSING FOR AN ELECTRIC DEVICE

[75] Inventor: Abraham Lev, Glenview, Ill.

[73] Assignee: Siemens Gammasonics, Inc., Hoffman Estates, Ill.

[21] Appl. No.: 458,033

[22] Filed: Dec. 28, 1989

[51] Int. Cl.⁵ .............................................. H05K 7/20
[52] U.S. Cl. ................................ 361/385; 174/12 R;
   174/17 LF; 174/17.05; 361/382
[58] Field of Search ............ 174/12 R, 17.05, 17 LF;
   361/380, 381–382, 385, 388, 389

[56] References Cited

U.S. PATENT DOCUMENTS 4,331,830  5/1982  Conway et al. ...................... 361/383

FOREIGN PATENT DOCUMENTS 989947   5/1976  Canada ............... 174/12 R
3206368  3/1985  Fed. Rep. of Germany .
3240724  2/1986  Fed. Rep. of Germany .

436468  11/1967  Switzerland .

*Primary Examiner*—Gregory D. Thompson
*Attorney, Agent, or Firm*—Mark H. Jay

[57] ABSTRACT

A housing for an electric device, such as a power transformer or an X-ray tube, comprises a tank which contains electric components of the device and which is filled with an insulating and/or cooling liquid, such as. A lid is arranged at a planar top portion of the tank and hermetically sealed thereto. The lid is at least partially flexible for enabling movement of the lid when the liquid expands and contracts due to heating and cooling, respectively. In a preferred embodiment, the lid comprises a gasket at its periphery and a rigid portion at its center. A frame can be provided for pressing the gasket against the tank. At the frame, at least one rod or spring can be fastened for guiding the movement of the lid perpendicular to the plane of the planar top portion.

23 Claims, 2 Drawing Sheets

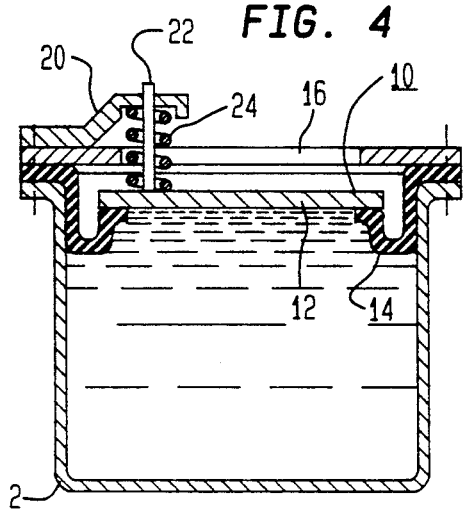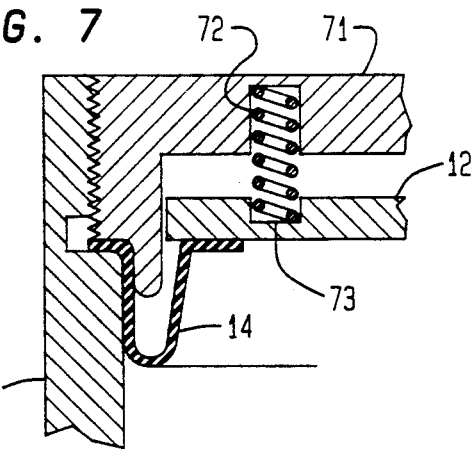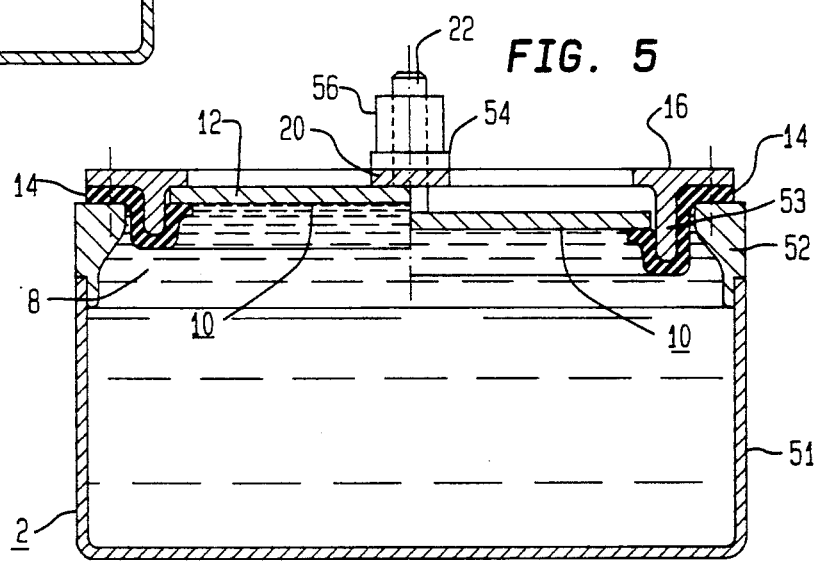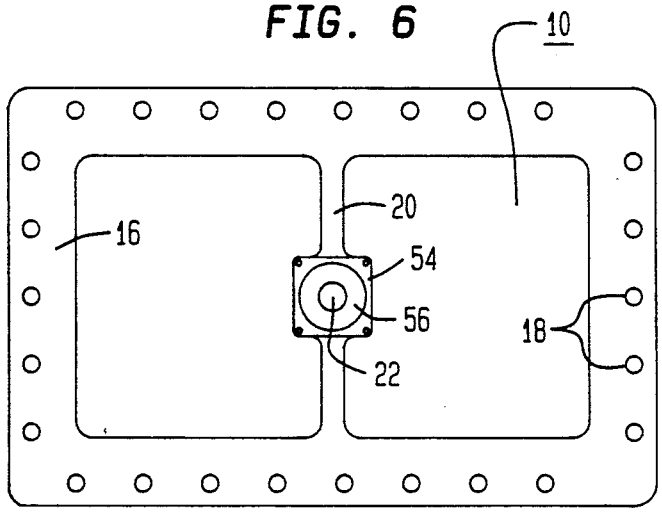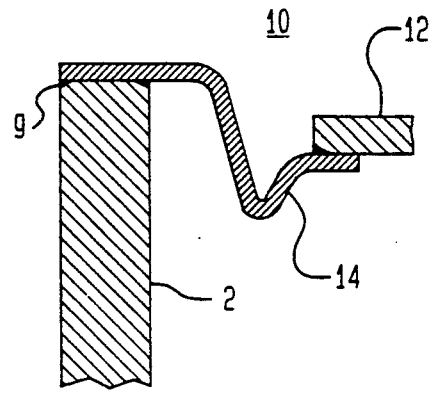

HOUSING FOR AN ELECTRIC DEVICE

BACKGROUND OF THE INVENTION

1. Technical Field

This invention relates to a housing for an electric device which comprises one or more electric components, such as a transformer or an X-ray tube and related components and which is filled with an insulating and/or cooling liquid, like mineral oil or a synthetic liquid. Such insulating and cooling liquids, and particularly oil, have the property of aging with time and temperature, especially if exposed to air which causes a sludge formation. If protected from air the formation of sludge is very effectively retarded at all temperatures. During operation of such an electric device, heat develops in the electric component or components and the liquid changes its volume because of its thermal expansion. Therefore, the housing should be on the one hand hermetically sealed and on the other hand constructed in a way that the liquid can easily expand.

2. Description of the Prior Art

From Swiss Patent CH-436,468 it has been known to put on top of an oil filled housing for a transformer an open expansion vessel which comprises a membrane separating the oil from open air in a hermetically sealed manner. This membrane consists of a combination of a metal foil and at least one layer made out of synthetic resin. When the oil expands and contracts, then the membrane extends upwardly and downwardly, respectively.

German Patent DE-3,206,368 also discloses a housing for a transformer and an extension vessel for the insulating and cooling liquid. The extension vessel comprises a membrane having the shape of a bag which floats on the surface of the oil and has an interior which is connected to the outer air.

Finally, German Patent DE-3,240,724 shows a housing for a transformer and a switching unit. The transformer is immersed in an insulating and cooling liquid and the switching unit which is surrounded by an insulating gas. In order to separate the liquid from the gas, a membrane is located between the oil and the gas. The membrane consists either of one flexible piece or of a combination of flexible pieces and rigid portions. Since this known housing consists of two parts which are separated by the membrane, many parts are necessary to build the housing and thus the production costs of the housing are high.

SUMMARY OF THE INVENTION

It is an object of the invention to provide a hermetically sealed housing for an electric device in which electrical components are immersed in an insulating and/or cooling liquid and which housing can be manufactured at low cost.

In accordance with the invention the housing comprises a tank which contains the electrical components and which comprises an insulating and/or cooling liquid. A lid covers the tank and seals it hermetically tight to a planar top portion thereof. This lid is at least partially flexible and enables movement of the lid perpendicular to the plane of the top portion when said liquid expands and contracts due to heating and cooling, respectively, of the liquid.

In a preferred embodiment the lid comprises a gasket at its periphery and a rigid portion at its center. A frame can be provided for pressing the gasket against the tank. At the frame or at the tank a guide means can be fastened for guiding the movement of the lid perpendicular to its plane and to prevent the lid from tilting. The guide means can be formed of rods which are connected to the lid and which project through openings in holders which are connected to the frame or to the tank. It can also be formed of springs which are arranged between the lid and the frame and which press the lid against the liquid. Preferably these springs are held in recesses in the lid and in the frame.

In another preferred embodiment the lid is formed of metal and has formations for providing a flexibility. The lid can be fastened to the tank by welding or soldering for hermetically sealing the tank.

Additional objects and features of the invention will be more readily appreciated and better understood by reference to the following detailed description which should be considered in conjunction with the drawings.

BRIEF DESCRIPTION OF THE DRAWINGS

FIG. 4 is a cross-sectional view of the first embodiment of the housing along line IV—IV in FIG. 3.

FIG. 5 depicts a cross-sectional view of a second embodiment of the housing according to the invention.

FIG. 6 illustrates a top view of the second embodiment of the housing.

FIG. 7 is a cross-sectional view of parts of a third embodiment of the housing according to the invention at low oil level.

FIG. 8 is a cross-sectional view of parts of a fourth embodiment of the housing according to the invention.

DETAILED DESCRIPTION

In the figures, elements having similar functions will be similarly numbered.

Figure 1:
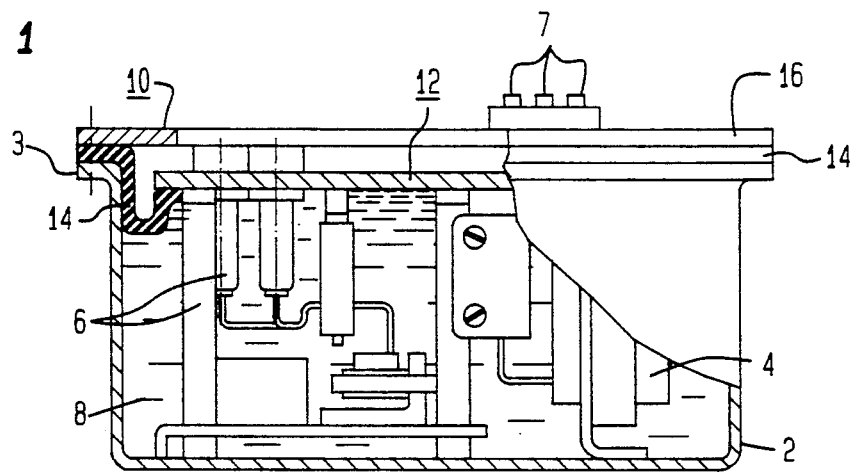
FIG. 1 depicts a cross-sectional view of a first embodiment of the housing according to the invention having a low oil level.

The housing shown in FIG. 1 comprises a tank 2 which includes electrical components, such as a power transformer 4 and related components 6 or a x-ray tube. Tank 2 comprises an insulating and/or cooling liquid 8, such as a mineral oil or a synthetic liquid. Tank 2 is covered with a lid 10. Lid 10 protects liquid 8 from air and also adapts to the level of liquid 8. Lid 10 comprises a rigid portion 12 to which components 6 and connectors 7 can be fastened and a flexible portion 14, e.g. a gasket. Flexible portion 14 can be made of fabric enforced nitrile and fastened to rigid portion 12, e.g. by vulcanizing. To rim 3 of tank 2 flexible portion 14 is fastened to upper portion 3 of tank 2 by a frame 16 and through screws (not shown in FIG. 1). Flexible portion 14 is preformed to provide enough room for rigid portion 12 to move upwardly and downwardly according to the expansion and contraction of liquid 8.

In FIG. 1 the housing is shown with a low level of liquid 8, as is the case, e.g., when the device is not operating.

Figure 2:
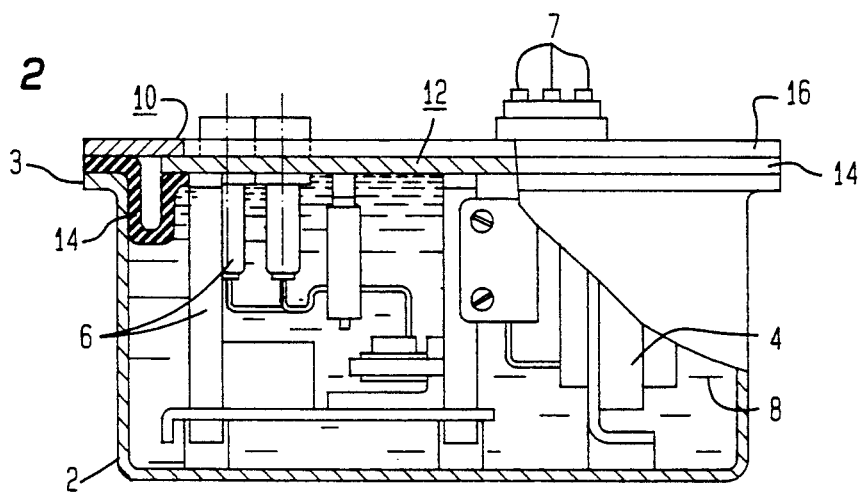
FIG. 2 illustrates a cross sectional view of the first embodiment of the housing having a high oil level.

FIG. 2 shows the same housing as in FIG. 1 at a high level of liquid 8, as is the case when the device is operating and components 4 and 6 dissipate heat which in turn heats up liquid 8 so that it increases its volume according to its thermal expansion factor. For completeness, it is also noted that the expansion or contraction of the liquid also takes place when the temperature of the environment changes.

Figure 3:
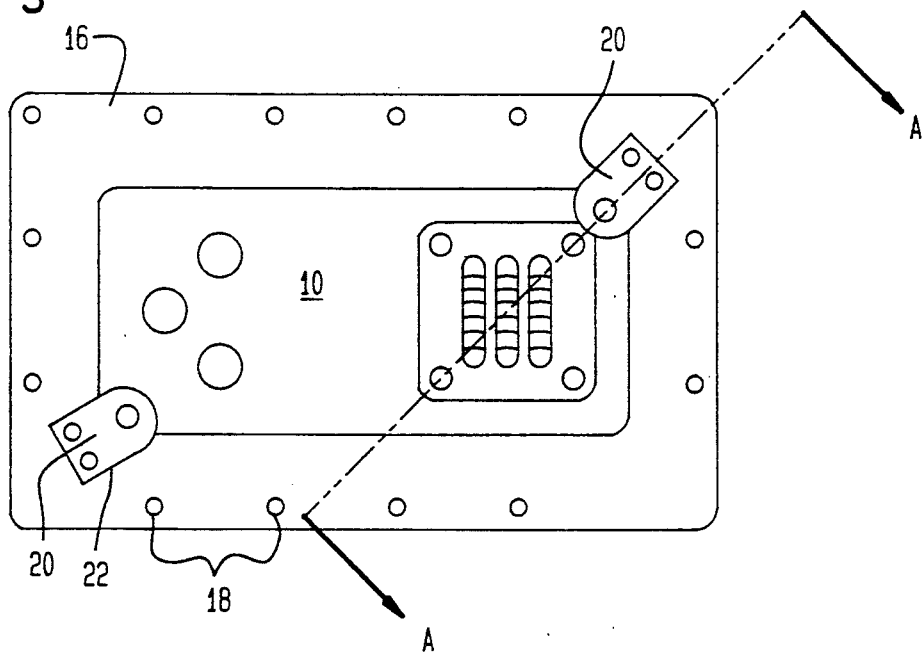
FIG. 3 is a top view of the first embodiment of the housing.

In FIG. 3 the top view of housing 2 shows that frame 16 is fastened to tank 2 using screws 18. On frame 16 holders 20 are fastened which serve as guides for rods 22. These rods 22 are connected to rigid portion 12 of lid 10 and compression springs (not shown in FIG. 3) are arranged which push lid 10 against liquid 8 so that it always floats on liquid 8. In the FIG. 3 embodiment two such holders 20 are arranged at diagonally opposite corners of frame 16 and lid 10 in order to prevent lid 10 from tilting. Holders 20 could also be fastened to tank 2 directly instead of to frame 16. From FIG. 3 there can also be seen that components 6 and connectors 7 are fastened to rigid portion 12 of lid 10.

The cross-sectional view depicted in FIG. 4 shows one holder 20 and a compression spring 24 arranged between holder 20 and lid 10 around rod 22. In this cross-sectional view transformer 4, components 6 and liquid 8 have been omitted for simplicity reasons.

FIG. 5 shows a second embodiment of the housing according to the invention which also comprises a tank 2 and a lid 10 which includes a rigid portion 12 and a flexible portion 14 like a gasket. In this cross-sectional view the electric components and liquid have been omitted for simplicity reasons, too. Tank 2 comprises in this embodiment a lower portion 51 and a upper frame like portion 52. Flexible portion 14 is preferably vulcanized to rigid portion 12 and flexible portion 14 is fastened to tank 2 by frame 16 via screws (not shown in FIG. 5). Frame 16 includes at its rim a downwardly extending projection 53 which forces flexible portion 14 to be bent downwardly.

In its middle portion frame 16 comprises a holder 20 on which a flange 54 with a bushing 56, e.g., a ball bushing, is fastened. Rod 22 extends through flange 54 and bushing 56 and is fastened to lid 10. Rod 22, together with flange 54 and bushing 56, controls the up and down movement of lid 10 when liquid 8 expands and contracts, respectively, and prevents lid 10 from tilting with respect to the plane of frame 16. On the left hand side of FIG. 5 the position of lid 10 is shown at a high level of liquid 8, whereas on the right hand side it is shown at a low level.

The top view depicted in FIG. 6 shows frame 16, flange 54 and lid 10. Frame 16 is e.g. an aluminum cast frame and it is fastened by screws 18 to tank 2. The middle portion of frame 16 includes a holder 20 which carries flange 54 together with bushing 56 for guiding rod 22 during the movement of lid 10.

In a further embodiment shown in FIG. 7, the movement of lid 10 is guided by a plurality of springs 71 which are held at their opposite ends in recesses 72 and 73 in frame 16 and in lid 10, respectively. Frame 16 can be a solid, threaded plug which clamps flexible portion 14 to tank 2.

In a still further embodiment illustrated in FIG. 8 flexible portion 14 consists of a preformed sheet metal. In this case flexible portion 14 can be soldered or welded to the upper rim 9 of tank 2 and to rigid portion 12 and thus be fastened hermetically tight. A guidance of lid 10 during its movement is not necessary in this embodiment, so that the holder and the rod can be omitted. A frame is not necessary in this case, either.

There has thus been shown and described a novel housing for an electric device which fulfills all the objects and advantages sought for. Many changes, modifications, variations and other uses and applications of the subject invention will, however, become apparent to those skilled in the art after considering the specification and the accompanying drawings which disclose embodiments thereof. All such changes, modifications, variations and other uses and applications which do not depart from the spirit and scope of the invention are deemed to be covered by the invention which is limited only by the claims which follow.

I claim:
1. A housing, comprising:
    a tank containing an insulating and/or cooling liquid; and
    a lid covering said tank and being hermetically sealed to a planar top portion thereof, said lid comprising a rigid portion at its center, and a flexible portion at its periphery coupled to said planar top portion for enabling movement of said lid perpendicular to the plane of said top portion when said liquid expands and contracts due to heating or cooling.
2. A housing according to claim 1, wherein said flexible portion is formed as a gasket surrounding said rigid portion.
3. A housing according to claim 2, wherein said gasket is fastened to said rigid portion by vulcanizing.
4. A housing according to claim 1, wherein a frame is provided on top of said lid for pressing said lid against said tank.
5. A housing according to claim 2, wherein a frame is provided for pressing said lid against said tank and wherein said frame includes downwardly extending protrusions for urging said gasket to be bent towards said liquid.
6. A housing according to claim 4, wherein guide means are fastened to said frame for guiding the movement of said lid in a direction perpendicular to the plane of said top portion.
7. A housing according to claim 6, wherein said guide means are arranged at a center of said frame and comprises a rod which is fastened to said lid and a holder which is fastened to the center of said frame and has an opening through which said rod is guided.
8. A housing according to claim 7, wherein a ball bushing is attached to said holder, said bushing having an opening through which said rod is guided.
9. A housing according to claim 6, wherein said guide means comprises two rods which are fastened to said lid and two corresponding holders which are fastened to said frame, each of said holders having an opening through which a corresponding one of said rods is guided.
10. A housing according to claim 9, wherein said lid is square and wherein said rods and said holders are connected to said lid and to said frame, respectively at its diagonally opposite corners.
11. A housing according to claim 10, wherein compression springs are arranged around said rods between said lid and said holders.
12. A housing according to claim 1, wherein said flexible portion is formed of metal and wherein said tank is hermetically sealed by fastening said lid to said tank and said rigid portion by welding or soldering.
13. A housing according to claim 4, wherein, compression springs are arranged between said frame and said lid.
14. A housing according to claim 13, wherein said compression springs are held in recesses in said lid and in said frame, respectively.

15. A housing according to claim 1, wherein said tank contains a transformer.

16. A housing according to claim 1, wherein said tank contains a X-ray tube.

17. A housing according to claim 1, wherein said insulating liquid is oil.

18. A housing comprising:
- a tank containing a transformer and including an insulating and/or cooling liquid;
- a lid covering said tank and being hermetically sealed to a planar top portion thereof, said lid comprising a rigid center portion and a gasket which is vulcanized to the periphery of said center portion and coupled to said planar top portion; and
- a frame arranged on top of said gasket for fastening said gasket hermetically tight to said tank.

19. A housing according to claim 18, wherein guide means are fastened to said frame for guiding the movement of said lid in a direction perpendicular to the plane of said top portion.

20. A housing according to claim 19, wherein said guide means are arranged at a center of said frame and comprises a rod which is fastened to said lid and a holder which is fastened to the center of said frame and has an opening through which said rod is guided.

21. A housing according to claim 19, wherein said guide means comprises two rods which are fastened to said lid and two corresponding holders which are fastened to said frame, each of said holders having an opening through which a corresponding one of said rods is guided.

22. A housing according to claim 18, wherein compression springs are arranged between said frame and said lid.

23. A housing, comprising:
- a tank containing an insulating and/or cooling liquid; and
- a lid covering said tank and being hermetically sealed to a planar top portion thereof, said lid comprising a rigid portion at its center to which electrical components are fastened, and a flexible portion at its periphery coupled to said planar top portion for enabling movement of said lid perpendicular to the plane of said top portion when said liquid expands and contracts due to heating or cooling.

* * * * *